United States Patent
Adler Fonseca D'Almeida et al.

(10) Patent No.: US 12,464,670 B2
(45) Date of Patent: Nov. 4, 2025

(54) ELECTROMECHANICAL BATTERY LOCKING SYSTEM IN A CABINET

(71) Applicant: ACUMULADORES MOURA S/A, Belo Jardim (BR)

(72) Inventors: Dean Adler Fonseca D'Almeida, Cabedelo (BR); Marcus Aurelius Barros De Oliveira, Belo Jardim (BR); Felipe Macedo Rocha, João Pessoa (BR); Tiago Emerson Teixeira De Araújo, Campina Grande (BR); Marcos Roberto Rodrigues Malveira, Recife (BR); Vinicius Vannucchi Pierre, Recife (BR); Rafael Nunes De Lima, Paulista (BR); Joao Paulo Fernandes Barbosa, Recife (BR); Henrique Figueroa Lacerda, Recife (BR); João Gabriel Machado Da Silva, Vitória de Santo Antão (BR); Spartacus Pereira Pedrosa, Belo Jardim (BR); Washington De Araújo Silva Júnior, Recife (BR); Antonio Gomes Pereira Júnior, Caruaru (BR)

(73) Assignee: ACUMULADORES MOURA S/A, Belo Jardim-PE (BR)

( * ) Notice: Subject to any disclaimer, the term of this patent is extended or adjusted under 35 U.S.C. 154(b) by 330 days.

(21) Appl. No.: 17/918,385

(22) PCT Filed: Apr. 14, 2021

(86) PCT No.: PCT/BR2021/050150
§ 371 (c)(1),
(2) Date: Oct. 12, 2022

(87) PCT Pub. No.: WO2021/207812
PCT Pub. Date: Oct. 21, 2021

(65) Prior Publication Data
US 2023/0134890 A1    May 4, 2023

(30) Foreign Application Priority Data

Apr. 15, 2020 (BR) .................... 102020007521-7

(51) Int. Cl.
*H05K 5/02* (2006.01)
*E05B 47/00* (2006.01)
(Continued)

(52) U.S. Cl.
CPC ........... *H05K 7/14* (2013.01); *E05B 47/0001* (2013.01); *H01M 50/202* (2021.01);
(Continued)

(58) Field of Classification Search
CPC ...... H05K 7/14; H05K 5/0221; H05K 5/0208; E05B 47/0001; E05B 2047/0048;
(Continued)

(56) References Cited

U.S. PATENT DOCUMENTS 9,275,505 B2    3/2016  Taylor et al.
10,202,785 B2*  2/2019  Overgaard ......... G07C 9/00174
(Continued)

FOREIGN PATENT DOCUMENTS

BR      PI1102114       3/2013
BR      102019003421    9/2020
WO      WO-2021024244   2/2021

OTHER PUBLICATIONS

International Search Report dated Jun. 28, 2021 in International Application No. PCT/BR2021/050150.
(Continued)

*Primary Examiner* — Imani N Hayman
*Assistant Examiner* — Hung Q Dang
(74) *Attorney, Agent, or Firm* — B. Aaron Schulman, Esq.; Stites & Harbison, PLLC

(57) ABSTRACT

"ELECTROMECHANICAL LOCKING SYSTEM FOR BATTERIES IN A CABINET" for application in a battery
(Continued)

pack used in uninterrupted power supply (UPS) systems comprising a locking set with at least one electromechanical lock and a coupling system attached to a bracket, where the referred bracket is attached to an UPS system cabinet structure; a battery with at least a lock housing and an alignment element.

7 Claims, 3 Drawing Sheets

(51) Int. Cl.
*H01M 50/202* (2021.01)
*H01M 50/262* (2021.01)
*H02J 9/06* (2006.01)
*H05K 7/14* (2006.01)

(52) U.S. Cl.
CPC ........... *H01M 50/262* (2021.01); *H02J 9/061* (2013.01); *H05K 5/0221* (2013.01); *E05B 2047/0048* (2013.01)

(58) Field of Classification Search
CPC .. E05B 2047/0095; E05B 47/02; E05B 73/00; H01M 50/202; H01M 50/262; H02J 9/061; G08C 17/02; Y02E 60/10
See application file for complete search history.

(56) References Cited

U.S. PATENT DOCUMENTS

| | | | |
|---|---|---|---|
| 11,156,020 B2* | 10/2021 | Lin | ................ E05B 47/0001 |
| 2001/0045778 A1 | 11/2001 | Ando et al. | |
| 2011/0316683 A1 | 12/2011 | Louis et al. | |
| 2018/0034036 A1 | 2/2018 | Perry et al. | |

OTHER PUBLICATIONS

Written Opinion dated Jun. 28, 2021 in International Application No. PCT/BR2021/050150.

* cited by examiner

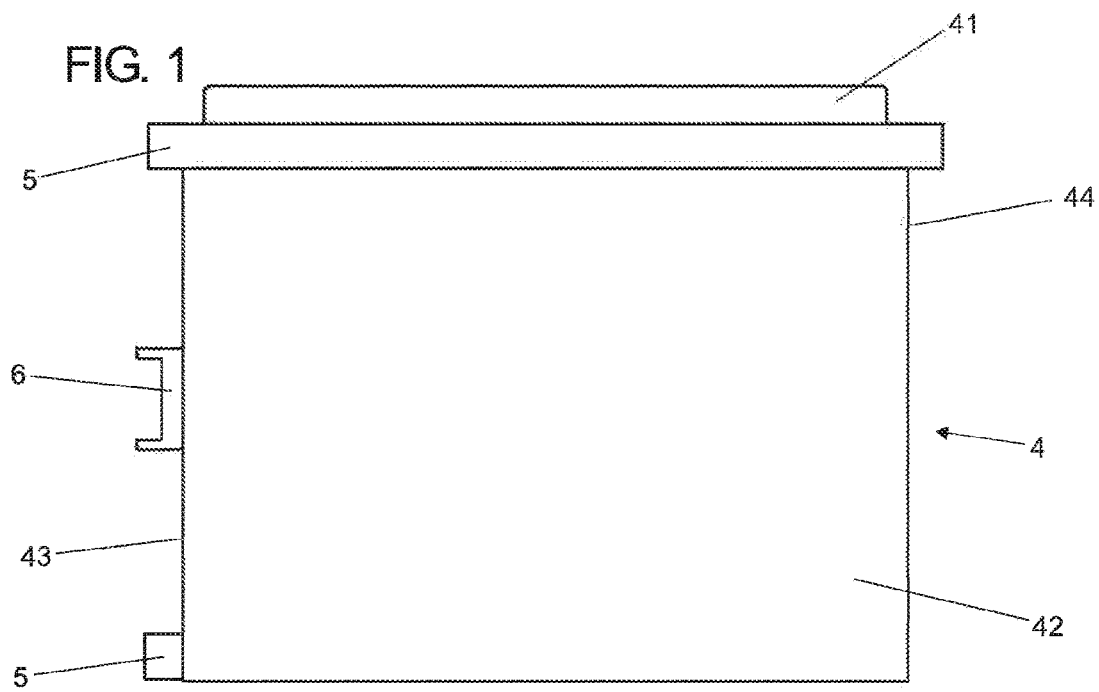
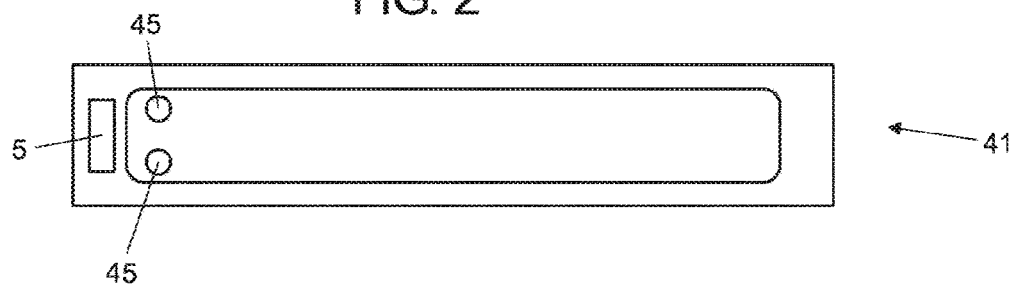
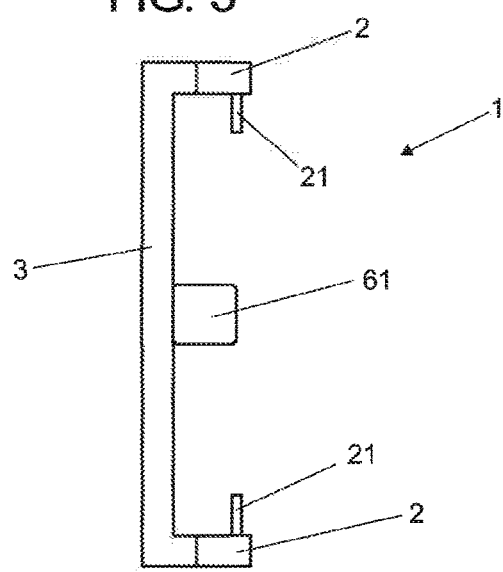

ELECTROMECHANICAL BATTERY LOCKING SYSTEM IN A CABINET

FIELD OF APPLICATION

This invention refers to a battery locking system, more specifically this invention refers to an electromechanical locking system for batteries inside a cabinet from an uninterrupted power supply installed in the field, in order to prevent the battery removal by non-authorized people.

DESCRIPTION OF THE STATE-OF-THE-ART

The use of battery packs as a secondary power supply has a great variety of applications, from the domestic use to the most different fields in the industry. Such battery packs are the uninterrupted power supplies or UPS, commonly referred to as No-Breaks.

In the Brazilian telecommunication market, one of the main challenges involving the management of Radio-Base Stations (RBSs) is the continuous thefts of the UPS system's batteries. A number of RBSs are installed in the field and/or in distant places and without continuous vigilance, making the UPSs batteries to be frequently stolen for use in vehicle audio systems, resale to other consumers or even for sales as scrap.

The telecommunication companies are estimated to suffer losses in the order of 30% of their battery farm, generating several problems, both in the purchase of new batteries and work for replacing such batteries in the field, and, in addition, the non-immediate battery replacement may cause failure and interruption of the RBS operation, resulting in fines and sanctions by the regulatory agencies.

In order to prevent this type of problem, there are some lines of action which can be implemented, such as:

Inhibiting the theft—solution which prevent or deter the removal of the battery from the RBS environment;

Disabling the battery operation—solution which, once a battery theft attempt has been identified, disable its operation, whether partially or permanently.

Tracking the battery—Tracking solution, georeferenced or not, allowing to identify the battery location, allowing to recover the asset and find the infringers.

Of the three solutions indicated above, the most feasible one, both economically and concerning its implementation, is to inhibit the theft, once the partial or total disabling of the battery still generates costs for replacing it, and tracking is difficult to be implemented once the recovery requires the use of police force.

The theft inhibition systems normally include the implementation of audible alarms in the RBSs. However, such solution is poorly efficient, because many RBSs are installed in distant places, making the access difficult and the alarm to be inefficient.

In order to prevent the battery from being stolen, ways to mechanically fix the battery into the RBS' locker or cabinet are normally used, whether by using resins or locking mechanisms.

The use of resins to fix the battery into the cabinet make it difficult or even prevents its replacement if needed, and, thus, it's a difficult to implement solution and hardly used.

The use of mechanical locks is efficient, but it causes some difficulties in case the battery requires replacement, because for the mechanical fixation is efficient, it cannot be exposed, so as to prevent violation by an infringer. Thus, the mechanical locks positioning and assembly also make the battery removal difficult by the technician in case of maintenance.

Thus, the state-of-the-art would benefit from a solution which presented a battery locking system in a UPS system which would be easy to implement and allow its removal by an authorized individual.

BRIEF DESCRIPTION OF THE INVENTION

This invention provides an electromechanical locking system for batteries, which allows the remote release of the battery, facilitating the maintenance and replacement of the same and making the access of non-authorized people who eventually want to violate the locking system difficult.

The electromechanical locking system makes use of a lock which fixes the battery to the locker or cabinet and is releases by remote action, which can be by means of a smartphone application or a command from a monitoring center.

Therefore, an objective of this invention is to provide a locking system which prevents the theft of batteries from UPS systems in RBSs.

Another objective of this invention is to provide a locking system which is easy to lock and receive.

A further objective of this invention is to provide a locking system which activated on a remote basis.

An additional objective of this invention is to provide a locking system easy to be implemented in already existing UPS systems.

Finally, an object of this invention is to allow that information concerning the lock activation and release is monitored and can be stored.

BRIEF DESCRIPTION OF THE DRAWINGS

The subject matter object of this Invention will be fully clear in its technical aspects from the detailed description which will be made based on the figures listed below, on which FIG. 1 presents a side view of a battery in a way to execute this invention, with two locking housings and an alignment element.

FIG. 2 presents an upper view of a battery cap in a way to execute this invention, where the lock housing is noted;

FIG. 3 presents a side view of a locking set of a way to execute this invention, with two electromechanical locks fixed in a bracket which has also a coupling to connect to the alignment element.

DETAILED DESCRIPTION OF THE INVENTION

Figure 4:
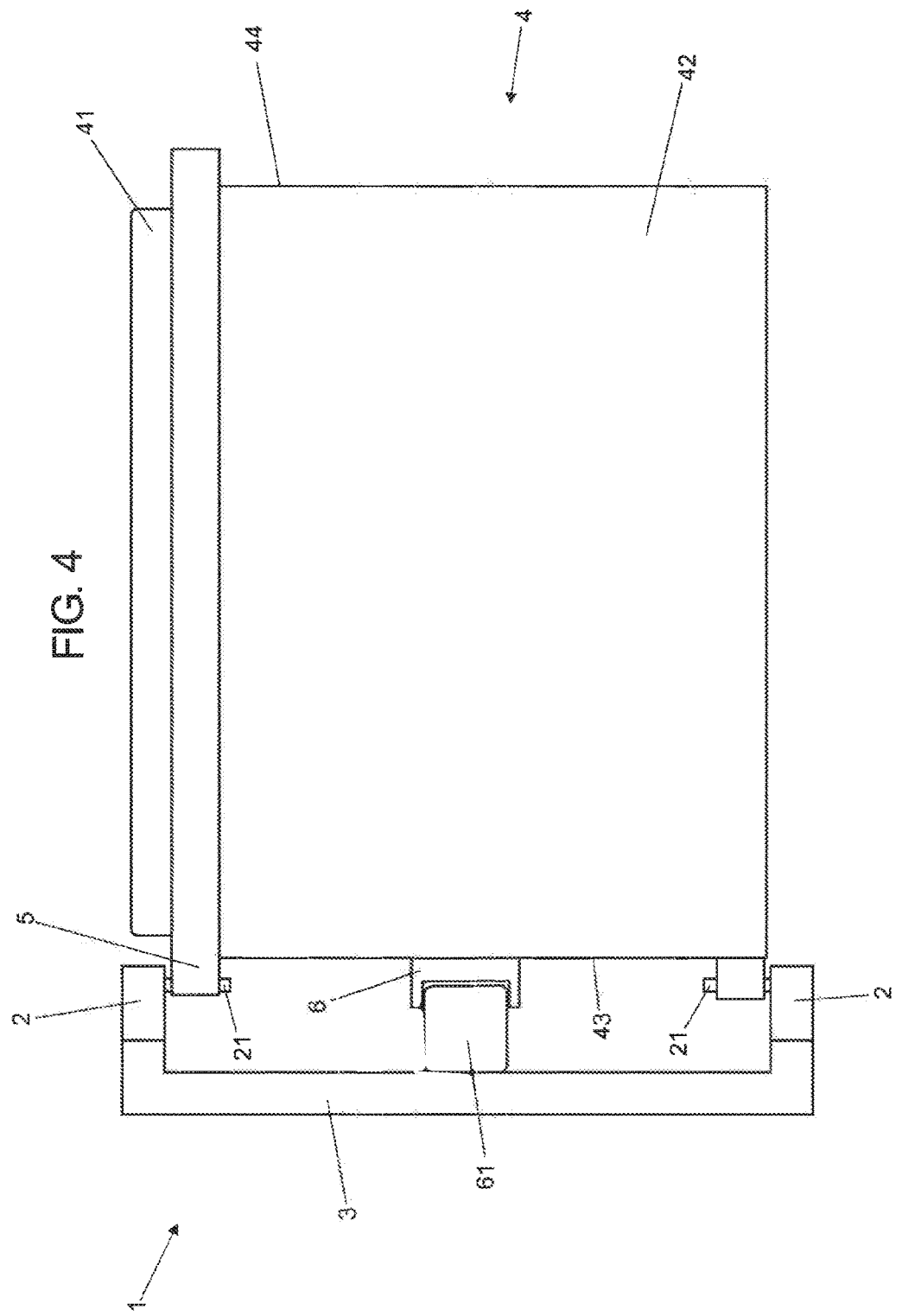
FIG. 4 presents a side view of the battery, of FIG. 1, and the locking set, of FIG. 3, coupled.

In compliance with the mentioned figures, this invention "ELECTROMECHANICAL LOCKING SYSTEM FOR BATTERIES IN A CABINET" comprises a locking set (1) comprising at least one electromechanical lock (2) and a coupling (61) fixed in a bracket (3), where the referred bracket (3) is attached to a cabinet structure (A) of a Radio-Base Station's (RBS) UPS system; a battery (4) with at least one lock housing (5) and an alignment element (6). The referred locking system further comprises a communication system for remote activation of the electromechanical lock (2), being that such communication system allows the activation and release of the electromechanical lock (2) to be conducted by an external device on a remote basis.

The battery (4) has a well (2) which involves the battery (4) components, a cap (41) located in the upper portion closing the well (42). In FIG. 1, it is possible to note a way to execute this invention with a lock housing (5) located in cap (41) and another lock housing (5) located in the lower portion of the back wall (43) of the well (42), an alignment element (6) is located in the central portion of the battery's (4) well (42) rear wall (43). In the execution form presented in FIG. 1, the well (42) front wall (44) is preferably the portion directed towards the UPS system's locker or cabinet (A) front.

In FIG. 2, it is possible to note the battery (4) cap (41), with a lock housing (5), located in the rear portion of the cap (41) close to the electric contacts (45). The lock housing (5) can have different formats, and it is preferably polygonal in order to reduce the battery (4) degree of freedom when the locking system is activated, thus, preventing, in addition to the linear movement, the rotary movement over the electromechanical lock (2).

In FIG. 3, it is possible to note a form to execute this invention, with a locking set (1) with two electromechanical locks (2) fixed to a bracket (3), where the referred electromechanical locks (2) are provided with a locking element (21) which fits in the lock housing (5) to lock the battery (4). In FIG. 3, it is also possible to note the coupling (6) which is coupled to the alignment element (6) to position the battery (4) in such a way that it is possible to lock it.

The electromechanical lock (2) is a lock comprising a relay which, when activated, releases the locking element (21), i.e., it is a normal closed lock, and, thus, in case of electric power shortage, the lock will remain closed.

In FIG. 4, it is possible to note the locking system with a locking set (1) according to the form of execution presented in FIG. 3, with the locking elements (21) of the electromechanical locks (2) fixing the battery (4), presented in FIG. 1, through the lock housings (5). It is also possible to note the alignment element (6) coupled to the coupling element (61).

Figure 5:
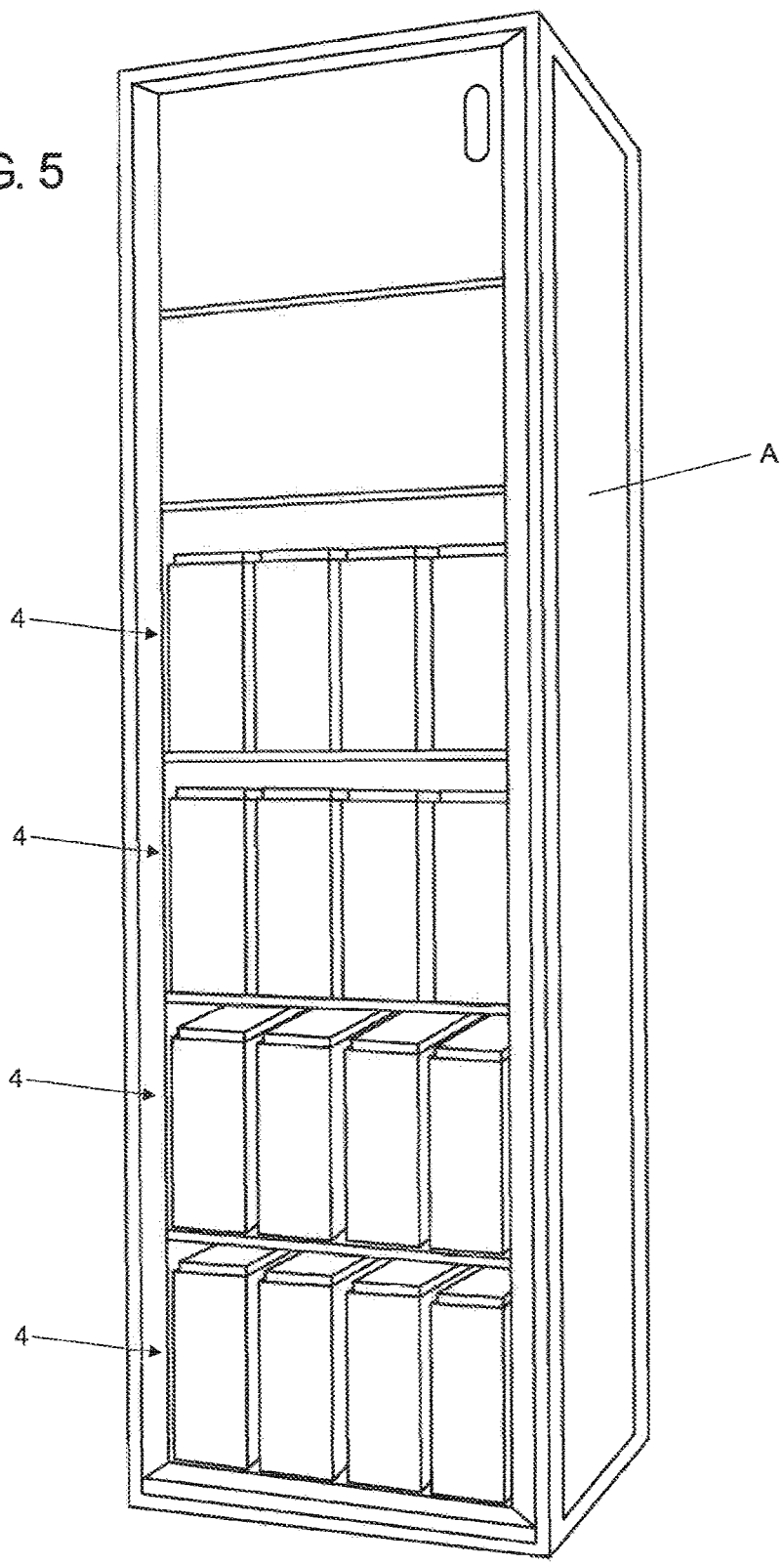
FIG. 5 present a perspective view of the cabinet, with batteries installed inside it.

The locking set (1) must have the bracket (3) fixed at the bottom of the UPS system's cabinet (A), so that it becomes inaccessible when battery (4) is installed in the referred cabinet (A), because its rear wall (44) is directed towards the UPS system's cabinet (A) door, as it is possible to note in FIG. 5, thus operating as a mechanic barrier which prevents the access to the locking system.

In a form to execute this invention, the electromechanical locks (2) are activated by an application in a smartphone, tablet or the like, where the activation application bears the record of the full execution of the service order, including the operator who proceeded with the installation, the operator's geographic location, the lock activation/deactivation time and the busbar voltage level. In addition, it must generate alerts of the battery fitting in the locking system and allow the locking activation and deactivation. This information is stored in a cloud environment, with data safety for subsequent audit of the installation process.

On an alternative for of executing this invention, the battery (4) can be placed inside a box preventing the battery from being removed from inside. The referred metal box is provided, in its rear wall, with at least a lock housing (5) and at least one alignment element (6), so as to enable the fitting of the locking set (1). In this execution form, it is not necessary any battery alteration. The metal box can be made as a single part, with welded joints, and may have crimped parts, etc., so that it cannot be opened when installed in the UPS system and prevents the battery from being removed. The referred metal box is made in such a way so that in can only be opened in a workshop, with special equipment, to remove the battery and reuse the box.

And another alternative form of executing this invention, 4 12-volt batteries can be grouped, joined by means of a special glue and placed into a plastic box or, further, in a metal box, so as to form a single 48-volt operational electric voltage block. The box is sealed and does not allow access to the batteries which comprise the set. In its rear wall, the referred sealed box presents at least one lock housing (5) and at least one alignment element (6), so as to allow the fitting of the locking set (1). In this execution form, in addition to the box locking, the weight of the 4 batteries together makes the removal of the referred box from an UPS system by an infringer difficult.

The locking system presented herein has the advantage of being easy to implement, once it can be implemented in an already existing RBS, in addition, it does not change the maintenance cost, once it allows the easy removal of the battery by an authorized person.

In addition, by using an application to activate and release the lock, this invention allows full control and tracking of the operations conducted in the RBS.

It should be understood that this description does not limit the implementation to the details described herein and that the invention is capable of other modalities and to be practiced or executed in a variety of modes, within the scope of the claims. Although specific terms have been used, such terms must be construed on a generic and descriptive sense, and not with a limiting purpose.

The invention claimed is:

1. An electromechanical locking system for batteries in a cabinet for application in a battery pack used in an uninterrupted power supply (UPS) system, said electromechanical locking system comprising a locking set with at least one electromechanical lock and a coupling system attached to a bracket, where the bracket is attached to a cabinet structure of the UPS system; said battery having at least a lock housing and an alignment element;
   wherein the battery has a well which contains battery components, and a cap located in an upper portion closing the battery well, a lock housing located in the cap and another lock housing located in the lower portion of the battery well's rear wall, and the alignment element is located in the central portion of a rear wall of the battery's well; and
   wherein the locking set is provided with two electromechanical locks attached to the bracket, where the electromechanical locks are provided with a locking element which fits in the lock housing to lock the battery, the locking set further comprising a coupling device which is coupled to the alignment element to position the battery so that it is possible to lock it.

2. The electromechanical locking system for batteries in a cabinet according to claim 1, wherein the electromechanical lock is a normally closed lock, which comprises a relay which, when activated, releases the locking element and ensures that the battery remains locked even if the power supply circuit of the cabinet and locks is deactivated.

3. The electromechanical locking system for batteries in a cabinet according to claim 1, further comprising a communication system for the remote activation of the electromechanical lock, wherein said communication system allows the activation and release of the electromechanical lock to be conducted by means of an external device on a remote basis.

4. The electromechanical locking system for batteries in a cabinet according to claim 3, wherein the electromechanical locks are activated by an application in a smartphone, tablet or the like, and allow lock activation and deactivation, wherein said application stores all the information in the cloud environment.

5. The electromechanical locking system for batteries in a cabinet according to claim 1, wherein the battery is placed inside a metal box, where the metal box is provided, in its rear wall, with the at least one lock housing and the at least one alignment element, so as to allow the fitting of the locking set.

6. The electromechanical locking system for batteries in a cabinet according to claim 1, wherein 12-volt batteries can be locked individually or can be grouped in a set of four 12-volt batteries, joined by a special glue and placed into a plastic box or in a metal box to form a single 48-volt operational electric voltage block, where the box does not allow access to the batteries which comprise the set, and in its rear wall the battery grouping is provided with the at least one lock housing and the at least one alignment element, so as to allow the fitting of the locking set.

7. The electromechanical locking system for batteries in a cabinet according to claim 3, wherein the electromechanical locks are activated by an application installed on a smartphone, tablet, or similar device, wherein said application records the entire execution of the service order, including the operator responsible for the installation, the operator's geographical location, the time of activation/deactivation of the lock, and the busbar voltage level, without requiring a battery management system attached to the battery.

* * * * *